(12) United States Patent
Batruni

(10) Patent No.: US 7,688,139 B2
(45) Date of Patent: *Mar. 30, 2010

(54) MODEL BASED DISTORTION REDUCTION FOR POWER AMPLIFIERS

(75) Inventor: Roy G. Batruni, Danville, CA (US)

(73) Assignee: Optichron, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/218,032

(22) Filed: Jul. 9, 2008

(65) Prior Publication Data

US 2009/0021304 A1 Jan. 22, 2009

Related U.S. Application Data

(62) Division of application No. 11/091,022, filed on Mar. 24, 2005, now Pat. No. 7,429,892.

(60) Provisional application No. 60/556,658, filed on Mar. 25, 2004.

(51) Int. Cl.
*H03F 1/26* (2006.01)
(52) U.S. Cl. .................................................... 330/149
(58) Field of Classification Search ................. 330/149, 330/151; 375/296–297; 455/63
See application file for complete search history.

(56) References Cited

U.S. PATENT DOCUMENTS 6,141,390 A 10/2000 Cova
6,459,334 B2 10/2002 Wright
7,099,399 B2 * 8/2006 McCallister ................. 375/269
2001/0014592 A1 8/2001 Helms

OTHER PUBLICATIONS

Hyun Woo Kwang et al: "An Efficient Adaptive Predistorter for Nonlinear High Power Amplifier in Satellite Communication" Circuits and Systems, 1997. ISCAS '97., Proceedings of 1997 IEEE International Symposium on Hong Kong, Jun. 9-12, 1997, New York, NY, USA, IEEE, US, vol. 4, Jun. 9, 1997, pp. 2288-2291, XP010236183 ISBN: 978-0-7803-3583-7.

Youngeheol Park et al: "Adaptive Predistortion Linearization of RF Power Amplifiers Using Lookup Tables Generated from Subsampled Data" Radio and Wireless Conference, 2002. RAWCON 2002, IEEE Aug. 11-14, 2002, Piscataway, NJ, USA, IEEE, Aug. 11, 2002, pp. 233-236, XP010601382 ISBN: 978-0-7803-7458-4.

Yuanming Ding et al: "Adaptive Nonlinearity Predistortion Schemes with Application to OFDM System" Proceedings of the 2003 IEEE International Conference on Control Applications. CCA 2003. Istanbul, Turkey, Jun. 23-25, 2003; [IEEE International Conference on Control Applications], New York, NY : IEEE, US, vol. 1, Jun. 23, 2003, pp. 1130-1135, XP010651946 ISBN: 978-0-7803-7729-5.

* cited by examiner

*Primary Examiner*—Robert Pascal
*Assistant Examiner*—Hieu P Nguyen
(74) *Attorney, Agent, or Firm*—Van Pelt, Yi & James LLP

(57) ABSTRACT

A method of processing a signal is disclosed. The method comprises generating a digital signal, converting the digital signal to an analog signal, and generating an amplified analog signal having distortions. The method further comprises converting the amplified analog signal to a feedback digital signal at a sample rate and updating a model of the distortions based on the feedback digital signal.

12 Claims, 9 Drawing Sheets

MODEL BASED DISTORTION REDUCTION FOR POWER AMPLIFIERS

CROSS REFERENCE TO OTHER APPLICATIONS

This application claims priority to U.S. Provisional Patent Application No. 60/556,658 entitled POWER AMPLIFIER LINEARIZING SYSTEM filed Mar. 25, 2004, which is incorporated herein by reference for all purposes.

This application is a divisional of co-pending U.S. patent application Ser. No. 11/091,022 entitled MODEL BASED DISTORTION REDUCTION FOR POWER AMPLIFIERS, filed Mar. 24, 2005 now U.S. Pat. No. 7,429,892, which is incorporated herein by reference for all purposes

BACKGROUND OF THE INVENTION

In designing a power amplifier, a number of factors need to be balanced against each other including specifications like linearity, high efficiency, low cost, or high power. For example, a Doherty-type power amplifier, as described in LUMPED ELEMENT BASED DOHERTY POWER AMPLIFIER TOPOLOGY IN CMOS PROCESS, by Tongchoi et. al. in *IEEE Int. Symp. Circuits and Systems*, May 2003, pp. 445-448 which is incorporated herein by reference for all purposes, may provide power efficiency at low cost, but may have nonlinearity. Improved linearity can be achieved using active compensation of the amplifier, where a measurement is made of the difference between the actual output of the amplifier and the desired output of the amplifier. The measurement of the difference between the actual and the desired outputs requires high-quality, high-speed, and therefore, expensive components. It would be useful to improve linearity of a power amplifier without requiring high-quality, high-speed, and expensive components.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Model based distortion reduction for power amplifiers is disclosed. Distortion introduced by power amplifiers can be reduced by adding a signal to the input of the amplifier that precompensates for the distortion. The model can reduce distortion up to the bandwidth of the input channel of the power amplifier. This bandwidth is limited by components in the input channel which can include a digital to analog converter. The feedback channel in this configuration can have substantially lower bandwidth requirements because the model parameters can be generated with feedback information at low update rates.

Figure 1A:
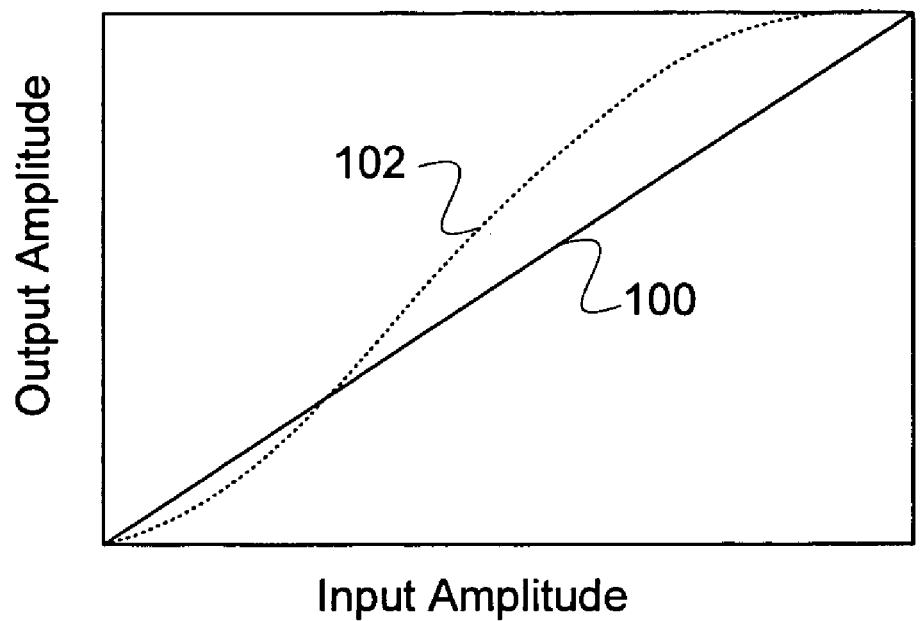
FIG. 1A illustrates an embodiment of input vs. output amplitude characteristics of a power amplifier.

FIG. 1A illustrates an embodiment of input vs. output amplitude characteristics of a power amplifier. In the examples shown, the ideal linear performance for a power amplifier is displayed by curve 100, which has a linear relation between the input amplitude and the output amplitude. Curve 102 represents a nonlinear performing power amplifier, which has a nonlinear relation between the input amplitude and output amplitude.

Figure 1B:
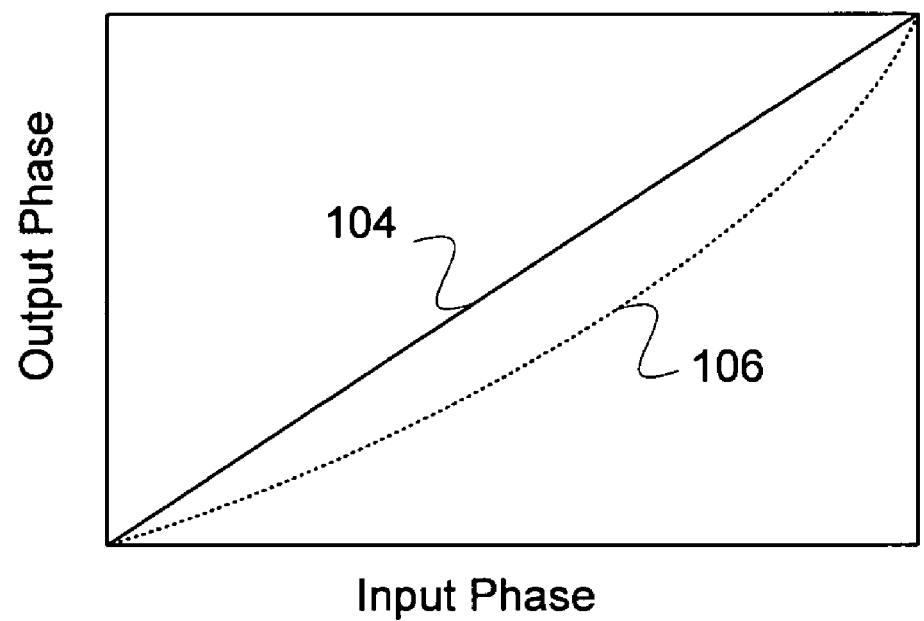
FIG. 1B illustrates an embodiment of input vs. output phase characteristics of a power amplifier system.

FIG. 1B illustrates an embodiment of input vs. output phase characteristics of a power amplifier system. In the examples shown, the ideal linear performance for a power amplifier system is displayed by curve 104, which has a linear relation between the input phase and the output phase. Curve 106 represents a nonlinear performing power amplifier system, which has a nonlinear relation between the input phase and output phase.

Figure 2:
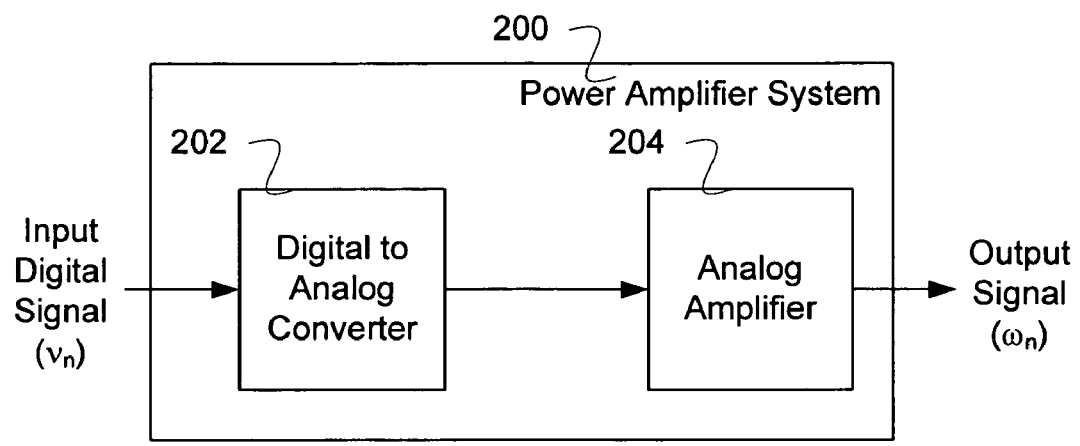
FIG. 2 illustrates an embodiment of a power amplifier system.

FIG. 2 illustrates an embodiment of a power amplifier system. Power amplifier system 200 includes digital to analog converter 202 and analog amplifier 204. An input digital signal ($v_n$) is input to digital to analog converter 202. The signal is then sent to analog amplifier 204 and then output as an analog output signal ($\omega_n$). In some embodiments, analog amplifier 204 has its own nonlinearity compensation.

Figure 3:
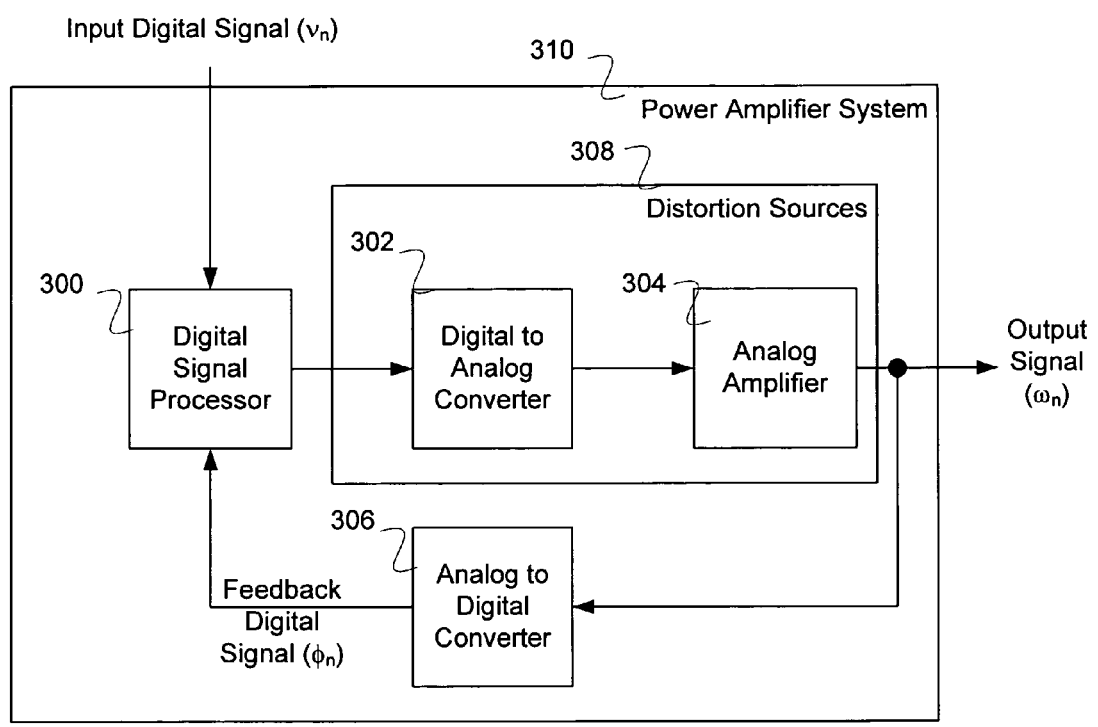
FIG. 3 illustrates an embodiment of a power amplifier system.

FIG. 3 illustrates an embodiment of a power amplifier system. Power amplifier system 310 includes digital signal processor 300, digital to analog converter 302, analog amplifier 304, and analog to digital converter 306. An input digital signal ($v_n$) is input to a digital signal processor 300, which corrects for distortions originating from distortion sources 308 by precompensating the signal. Distortion sources 308 include digital to analog converter 302 and analog amplifier 304. Digital signal processor 300 outputs a signal to digital to analog converter 302. The signal is then sent to analog amplifier 304 and then output as an analog output signal ($\omega_n$). The output signal is also sent to analog to digital converter 306 to create feedback signal ($\phi_n$) that is sent to digital signal processor 300. In some embodiments, analog to digital converter 306 conversion rate is selectable. In some embodiments, analog to digital converter 306 conversion rate is much lower than digital to analog converter 302 conversion rate. In some embodiments, analog to digital converter 306 conversion rate is lower than the bandwidth of the distortion in the output signal ($\omega_n$).

Figure 4:
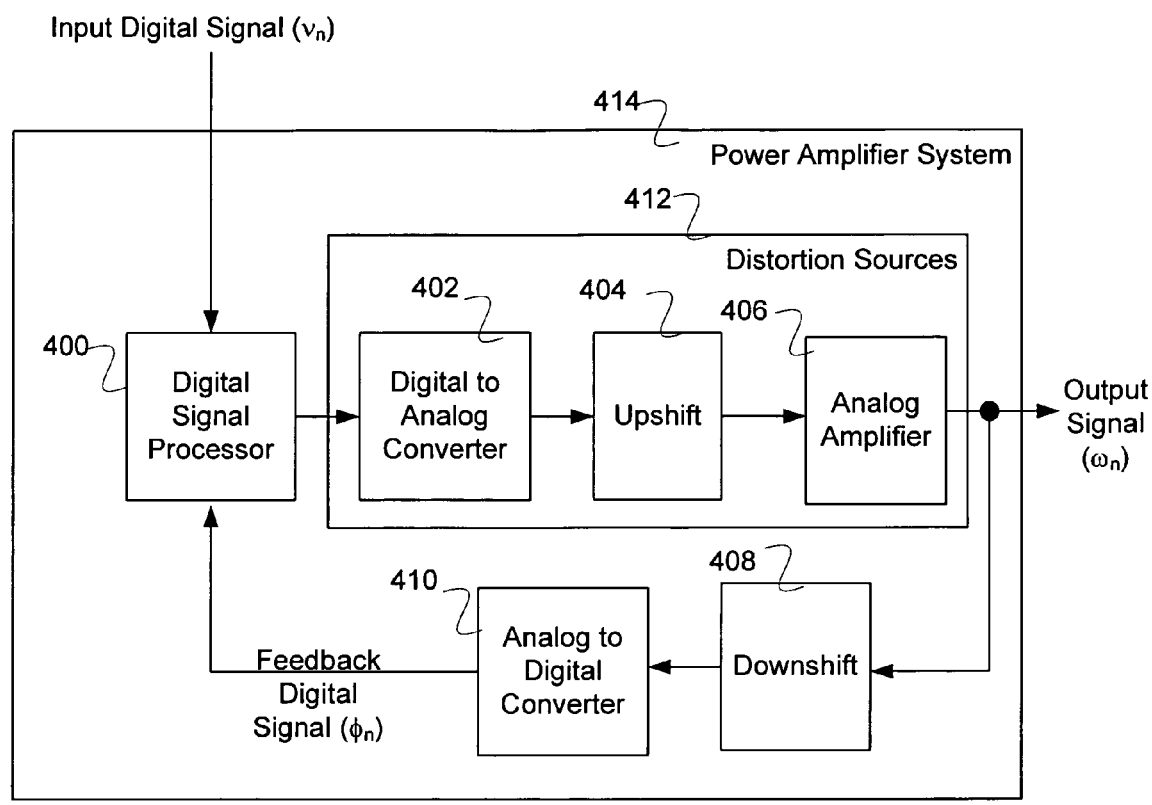
FIG. 4 illustrates an embodiment of a power amplifier system.

FIG. 4 illustrates an embodiment of a power amplifier system. Power amplifier system 414 includes digital signal processor 400, digital to analog converter 402, upshift 404, analog amplifier 406, downshift 408, and analog to digital converter 410. An input digital signal ($v_n$) is input to a digital signal processor 400, which corrects for distortions originating from distortion sources 412 by precompensating the signal. Distortion sources 412 include digital to analog converter 402, upshift 404, and analog amplifier 406. Digital signal processor 400 outputs a signal to digital to analog converter 402. The signal is then sent to upshift 404 which shifts the signal up to a higher frequency band. The signal is then sent to analog amplifier 406 and then output as an analog output signal ($\omega_n$). The output signal is also sent to downshift 408 which shifts the signal down to a lower frequency. The signal is then sent to analog to digital converter 410 to create feedback signal ($\phi_n$) that is sent to digital signal processor 400. In some embodiments, shifting a signal up includes modulating a signal at a different, higher frequency and shifting a signal down includes demodulating a signal at a different, lower frequency.

Figure 5:
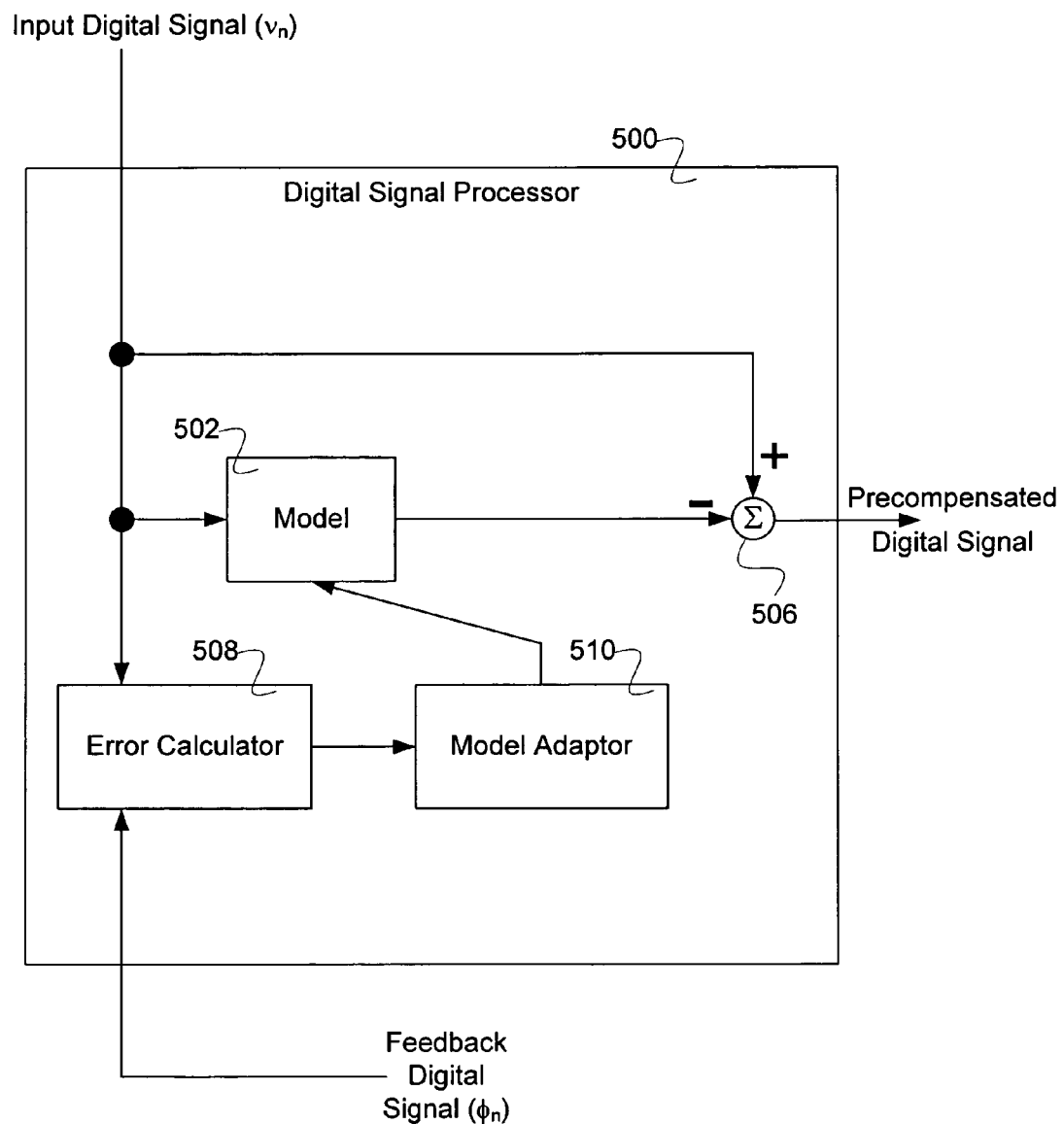
FIG. 5 illustrates an embodiment of a signal processing system for precompensating a digital signal for reducing distortion in a power amplifier system.

FIG. 5 illustrates an embodiment of a signal processing system for precompensating a digital signal for reducing distortion in a power amplifier system. Input digital signal ($v_n$) enters digital signal processor 500. The input digital signal ($v_n$) is sent to model 502 which calculates a signal that is fit to be similar to the nonlinear distortions of the power amplifier system. The model calculated signal is sent to a summation node 506 along with input digital signal ($v_n$) to create a precompensated digital signal. The precompensated digital signal has the eventual power system distortion subtracted out from the input digital signal ($v_n$). This reduces the distortion at the power amplifier system output. In various embodiments, the model calculated signal is removed from the input digital signal ($v_n$) in different ways such as subtracting the signal, inverting the signal, shifting the phase of the signal, or any other appropriate technique. Error calculator 508 calculates the error signal based on the input digital signal ($v_n$) and the feedback digital signal ($\phi_n$). The error signal is input to model adaptor 510. Model adaptor 510 creates a model that can calculate the distortions of the power amplifier system given the input digital signal ($v_n$). In some embodiments, model adaptor 510 uses least mean square adaptation to calculate the model. In some embodiments, model adaptor 510 uses recursive least squares adaptation to calculate the model. Model adaptor 510 feeds model parameters to model 502. In some embodiments, the model parameters are updated at a selectable rate. In some embodiments, the model corrects for distortions at bandwidths up to half the frequency of the digital to analog converter conversion rate. So, the distortions in the amplified analog output signal can be reduced for frequencies higher than half the sample rate of the feedback digital signal as would be anticipated if using a standard feedback correction method.

In some embodiments, the model adaptor adapts a model of the distortion by minimizing the error signal. In some embodiments, the model includes memory effects. In some embodiments, the model can be a finite impulse response filter or an infinite impulse response filter. In some embodiments, the model is a nonlinear filter. In some embodiments, the filter is a low-complexity nonlinear filter that is comprised of linear pieces as described in U.S. patent application Ser. No. 11/061,850 entitled LOW-COMPLEXITY NONLINEAR FILTERS filed Feb. 18, 2005 which is incorporated herein by reference for all purposes. The basis for this nonlinear filter is the nonlinear function:

$$\hat{\eta}_n = A^T Y_n + b + \sum_{j=1}^{K} c_j |\vec{\alpha}_j Y_n + \beta_j|$$

which, given sign ($\vec{\alpha}_j Y_n + \beta_j$)=$\lambda_{jn}$, is implemented as $$\hat{\eta}_n = \left(a_0 + \sum_{j=1}^{K} c_j \alpha_{0,j} \lambda_{jn}\right) y_n + \ldots + \left(a_N + \sum_{j=1}^{K} c_j \alpha_{N,j} \lambda_{jn}\right) y_{n-N} + \left(b + \sum_{j=1}^{K} c_j \beta_j \lambda_{jn}\right).$$

This correlates one-to-one with $$\hat{\eta}_n = \tilde{a}_{0,n}(Y_n) y_{n+} \ldots + \tilde{a}_{N,n}(Y_n) y_{n-N} + \tilde{b}_n(Y_n)$$

which forms a "linear" combination of the input variables $Y_n$ using the "weights" or coefficients $\tilde{a}_{k,n}(Y_n)$ that vary as a nonlinear function of those input variables. The overall filter includes a "linear" combination at time n of the elements of the vector $Y_n$ utilizing the coefficients $\tilde{a}_{k,n}(Y_n)$ as weights. This filtering construct is specifically designed to comply with our interpretation that the nonlinear channel is equivalent to a linear channel whose time constants are a function of the input vector, an effect that renders the channel nonlinear.

The nonlinear filter implementation can be embodied in a low-complexity form that reduces the number of multiply operations while maintaining a powerful ability to emulate very complex nonlinear distortion functions. Reducing complexity lowers cost, lowers power dissipation, and reduces noise. The reduced-complexity basis for the nonlinear filter removes the requirements for multiply operations when computing the nonlinear coefficients has the form:

$$\hat{\eta}_n = A^T Y_n + b + \sum_{j=1}^{K_1} c_j |y_n + \beta_j| + \sum_{j=K_1+1}^{K_2} c_j |y_{n-1} + \beta_j| \ldots +$$

$$\sum_{j=K_{2N-3}+1}^{K_{2N-2}} c_j |y_{n-N} + \beta_j|$$

$$= A^T Y_n + b + \sum_{j=1}^{K_1} c_j \lambda_{j,n}(y_n + \beta_j) + \sum_{j=K_1+1}^{K_2} c_j \lambda_{j,n}(y_{n-1} + \beta_j) \ldots +$$

-continued $$\sum_{j=K_{2N-3}+1}^{K_{2N-2}} c_j \lambda_{j,n}(y_{n-N} + \beta_j)$$

and letting $$\lambda_{j,n} = \text{sign}(y_{n-1} + \beta_j)$$

means $$\hat{\eta}_n = \left(a_0 + \sum_{j=1}^{K_1} c_j \lambda_{jn}\right) y_n + \ldots +$$

$$\left(a_{2n-2} + \sum_{j=K_{2N-3}+1}^{K_{2N-2}} c_j \lambda_{jn}\right) y_{n-N} + \left(b + \sum_{j=1}^{K} c_j \beta_j \lambda_{jn}\right)$$

which effectively does not require multiply operations in the coefficient computation (where each $c_j \beta_j$ product is pre-computed and stored as one coefficient). This form is termed a first-order nonlinear filter since each coefficient multiplies at most a power-of-one element of the filter input vector $Y_n$. In some embodiments, the model uses a second-order nonlinear filter:

$$\hat{\eta}_n = a_0 y_n + a_1 y_{n-1} + b + \sum_{j=1}^{K} c_j^0 |y_n + \beta_j^0| y_n + \sum_{j=1}^{K} c_j^1 |y_{n-1} + \beta_j^1| y_{n-1}$$

$$= \left(\sum_{j=1}^{K} c_j^0 \lambda_j^0\right) y_n^2 + \left(\sum_{j=1}^{K} c_j^1 \lambda_j^1\right) y_{n-1}^2 + \left(a_0 + \sum_{j=1}^{K} c_j^0 \lambda_j^0 \beta_j^0\right) y_n +$$

$$\left(a_1 + \sum_{j=1}^{K} c_j^1 \lambda_j^1 \beta_j^1\right) y_{n-1} + b$$

$$= \tilde{a}_{01,n} y_n^2 + \hat{a}_{1,n} + y_{n-1}^2 + \tilde{a}_{0,n} y_n + \tilde{a}_{1,n} y_{n-1} + b$$

where each coefficient is a nonlinear function of the input vector elements and each coefficient either multiplies a power-of-two element or cross-product-of-two elements. In some embodiments, a second-order nonlinear filter that allows an output that is a function of the elements or cross-product-of-two elements is $$\hat{\eta}_n = a_0 y_n + a_1 y_{n-1} + b + \sum_{j=1}^{K} c_j^0 |y_n + \beta_j^0| y_n + \sum_{j=1}^{K} c_j^1 |y_{n-1} + \beta_j^1| y_n$$

$$= \left(\sum_{j=1}^{K} c_j^0 \lambda_j^0\right) y_n^2 + \left(\sum_{j=1}^{K} c_j^1 \lambda_j^1\right) y_n y_{n-1} + \left(a_0 + \sum_{j=1}^{K} c_j^0 \lambda_j^0 \beta_j^0 + \sum_{j=1}^{K} c_j^1 \lambda_j^1 \beta_j^1\right) y_n +$$

$$a_1 y_{n-1} + b$$

$$= \tilde{a}_{01,n} y_n^2 + \hat{a}_{1,n} + y_n y_{n-1} + \tilde{a}_{0,n} y_n + a_{1,n} y_{n-1} + b$$

In some embodiments, the nonlinear filter is the zero-order catastrophic filter:

$$\hat{\eta}_n = a_0 y_n + a_1 y_{n-1} + b + \sum_{j=1}^{K} c_j^0 \text{sign}(y_n + \beta_j^0) + \sum_{j=1}^{K} c_j^1 \text{sign}(y_{n-1} + \beta_j^1)$$

$$= a_0 y_n + a_1 y_{n-1} + b + \left(\sum_{j=1}^{K} c_j^0 \lambda_j^0\right) + \left(\sum_{j=1}^{K} c_j^1 \lambda_j^1\right)$$

In some embodiments, higher-order nonlinear filter implementations can also be used, as well as combinations of first-order and second-order nonlinear filter.

Figure 6:
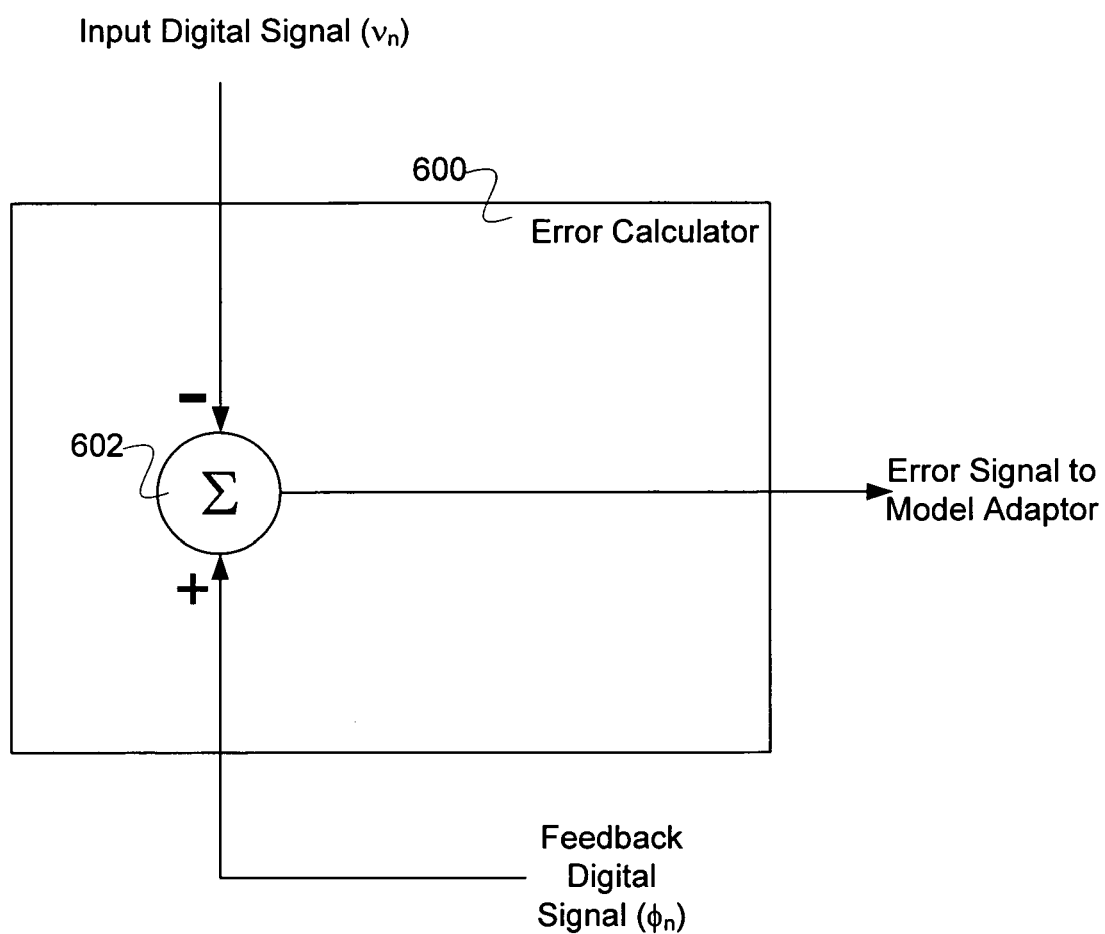
FIG. 6 illustrates an embodiment of an error calculator.

FIG. 6 illustrates an embodiment of an error calculator. Error calculator 600 has as inputs a) input digital signal ($v_n$) and b) feedback digital signal ($\phi_n$). Error calculator 600 calculates an error signal by taking the difference between the two inputs. In some embodiments, the digital signal ($v_n$) is subtracted from feedback digital signal ($\phi_n$) by summation node 602. In some embodiments, the feedback digital signal ($\phi_n$) is subtracted from digital signal ($v_n$) by summation node 602. If the feedback digital signal ($\phi_n$) is the same as the input digital signal ($v_n$), then the error signal is zero.

Figure 7:
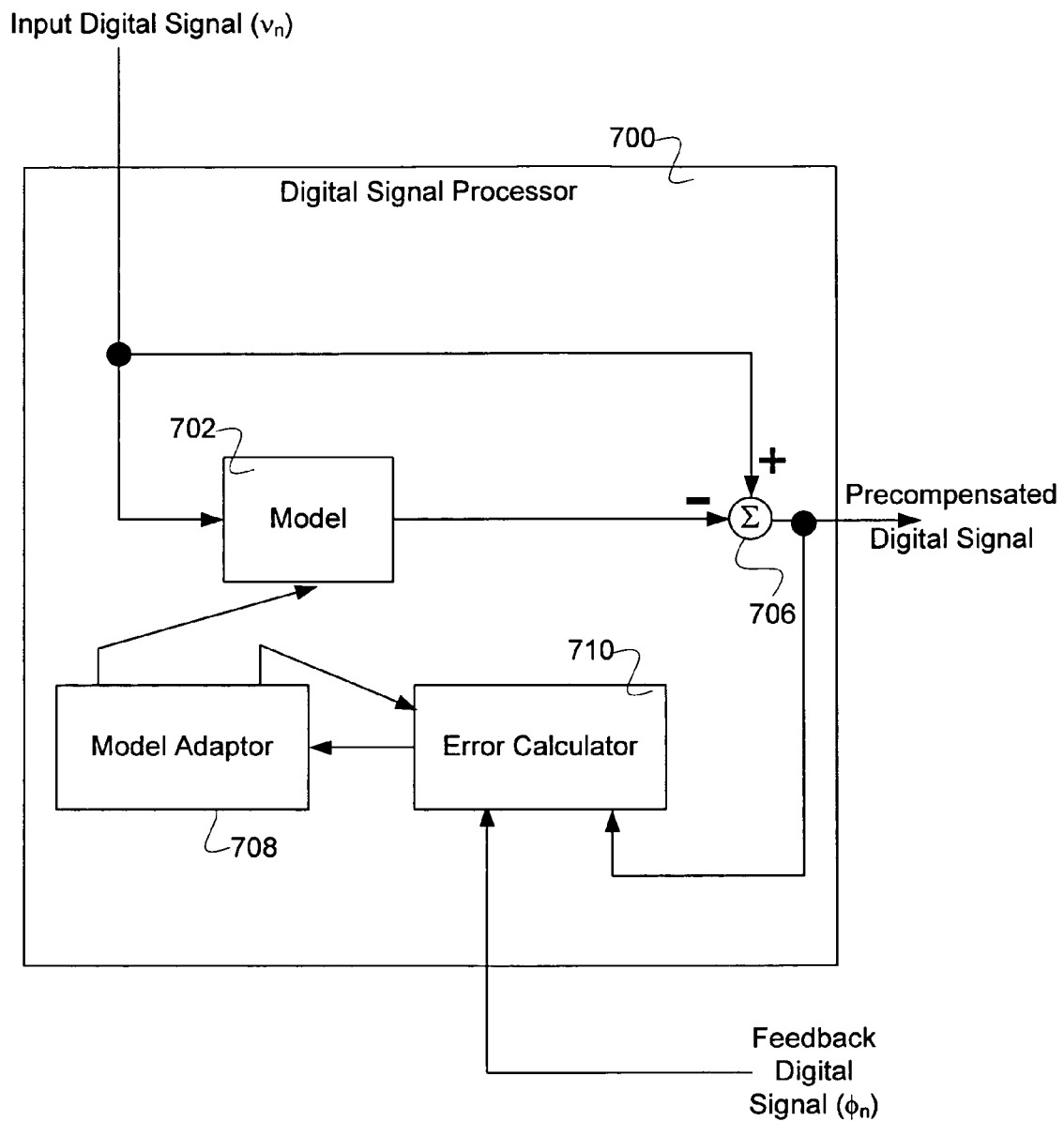
FIG. 7 illustrates an embodiment of a signal processing system for precompensating a digital signal for reducing distortion in a power amplifier system.

FIG. 7 illustrates an embodiment of a signal processing system for precompensating a digital signal for reducing distortion in a power amplifier system. Input digital signal ($v_n$) enters digital signal processor 700. The input digital signal ($v_n$) is sent to model 702 which calculates a signal that is fit to be similar to the nonlinear distortions of the power amplifier system. The model calculated signal is sent to a summation node 706 along with input digital signal ($v_n$) to create a precompensated digital signal. The precompensated digital signal has the eventual power system distortion subtracted out from the input digital signal ($v_n$). This reduces the distortion at the power amplifier system output. In various embodiments, the model calculated signal is removed from the input digital signal ($v_n$) in different ways such as subtracting the signal, inverting the signal, shifting the phase of the signal, or any other appropriate technique. Error calculator 710 calculates the error signal based on the precompensated digital signal and the feedback digital signal ($\phi_n$). The error signal is input to model adaptor 708. Model adaptor 708 creates a model that can calculate the distortions of the power amplifier system given the input digital signal ($v_n$). In some embodiments, the model is adaptive. In some embodiments, model adaptor 708 uses least mean square adaptation to calculate the model by making the error signal as close to zero as possible. In some embodiments, model adaptor 708 uses recursive least squares adaptation to calculate the model by making the error signal as close to zero as possible. Model adaptor 708 feeds model parameters to model 702 and error calculator 710.

Figure 8:
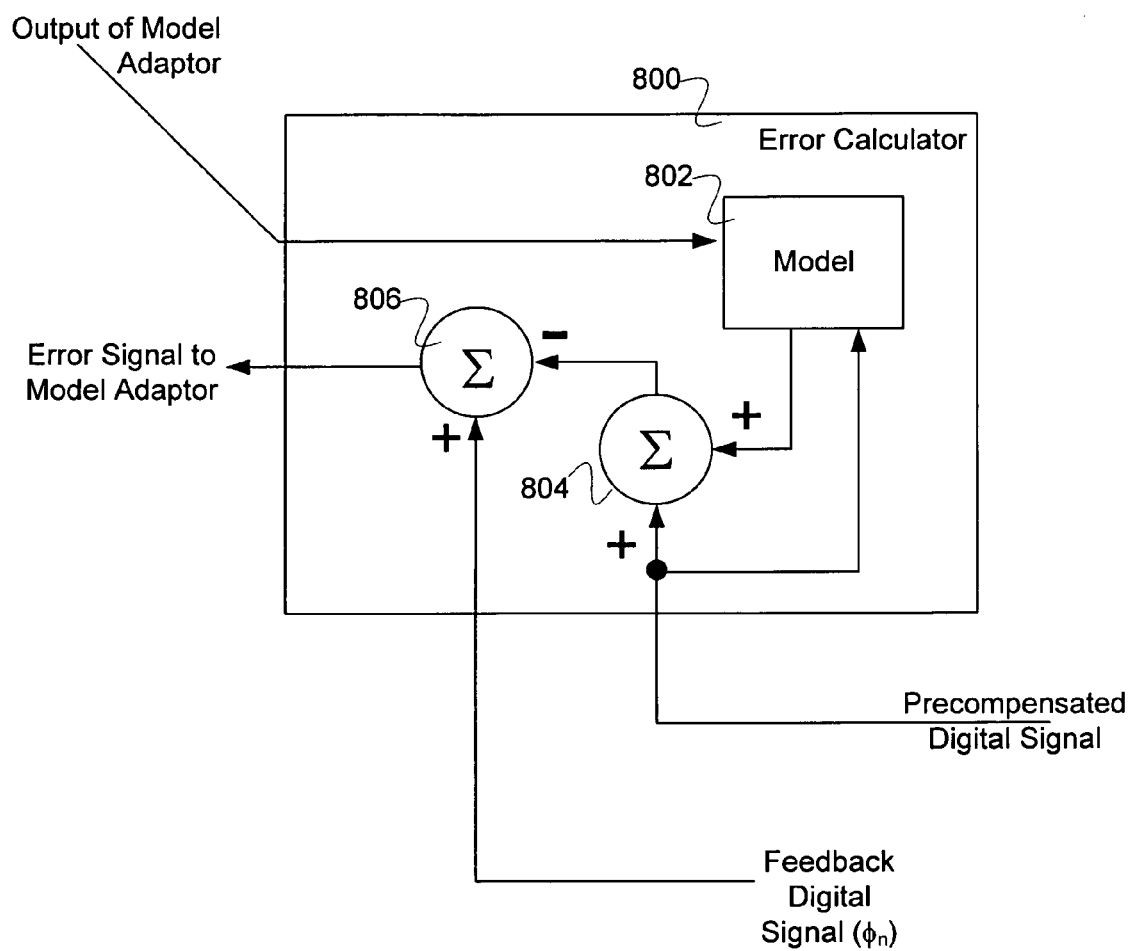
FIG. 8 illustrates an embodiment of an error calculator.

FIG. 8 illustrates an embodiment of an error calculator. Error calculator 800 has as inputs a) precompensated digital signal, b) feedback digital signal ($\phi_n$), and c) model adaptor output. Error calculator 800 calculates an error signal by taking the difference between the feedback digital signal (in) and the sum of the precompensated digital signal and the model processed precompensated digital signal. In some embodiments, the sum of the precompensated digital signal and the model processed precompensated digital signal, created by summation node 804, is subtracted from feedback digital signal ($\phi_n$) by summation node 806. The sum of the precompensated digital signal and the model processed precompensated digital signal is approximately equivalent to the input digital signal ($v_n$). The feedback digital signal ($\phi_n$) is also approximately equivalent to the input digital signal ($v_n$) plus the distortions not cancelled by the precompensation. Thus, subtracting the sum from the feedback digital signal ($\phi_n$) gives an error signal proportional to the distortions not cancelled by the precompensation.

In some embodiments, the feedback digital signal ($\phi_n$) is subtracted by summation node 806 from the sum of the precompensated digital signal and the model processed precompensated digital signal which is created by summation node 804. The overall sign of the feedback error signal is not critical to driving the error signal to zero. In some embodiments, the subtraction operation on two signals is achieved by shifting the phase of one signal by 180° and adding it to the other signal. In some embodiments, the subtraction operation on two signals is achieved by inverting one signal and adding it to the other signal.

Figure 9:
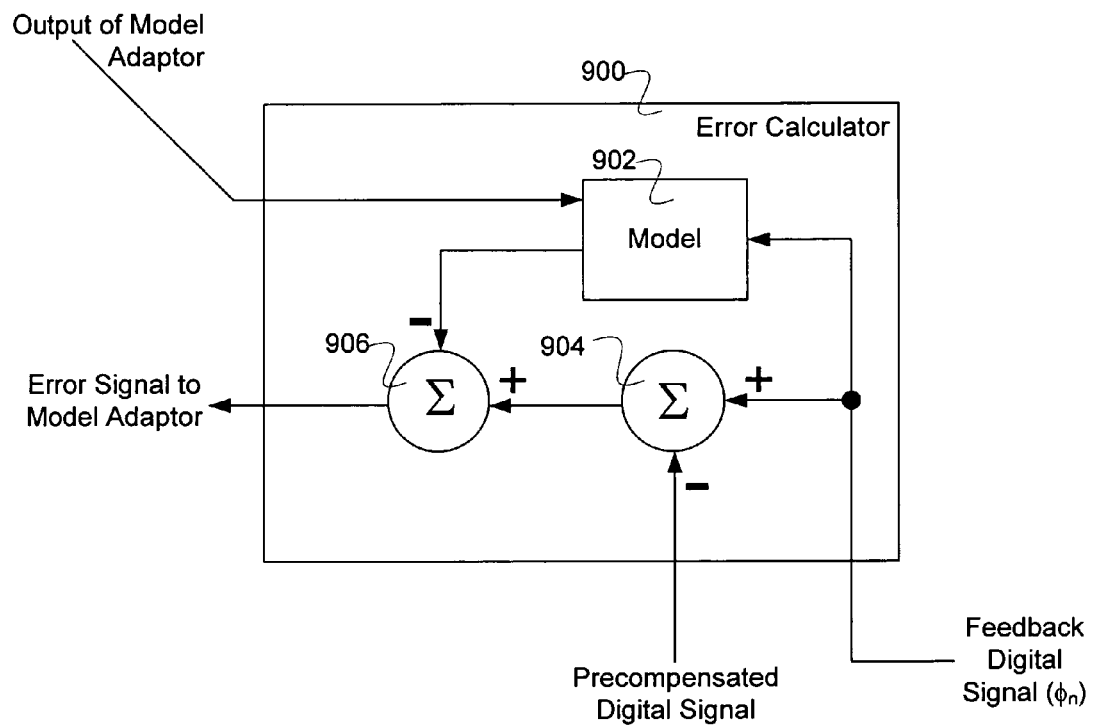
FIG. 9 illustrates an embodiment of an error calculator.

FIG. 9 illustrates an embodiment of an error calculator. Error calculator 900 has as inputs a) precompensated digital signal, b) feedback digital signal ($\phi_n$), and c) model adaptor output. Error calculator 900 calculates an error signal by taking the difference between the model processed feedback digital signal ($\phi_n$) and the difference between of the feedback digital signal ($\phi_n$) and the precompensated digital signal.

In some embodiments, the difference of the feedback digital signal ($\phi_n$) and the inverse of the precompensated digital signal is achieved by adding the inverse of the precompensated digital signal to the feedback digital signal ($\phi_n$). In some embodiments, the model processed feedback digital signal ($\phi_n$) is subtracted, in summation node 906, from the output of summation node 904 which subtracts the feedback digital signal ($\phi_n$) from the precompensated digital signal. In some embodiments, the signs are different for the summations since the overall sign of the error signal is not important.

The output of summation node 904 is the precompensated digital signal subtracted from the feedback digital signal ($\phi_n$), or the input digital signal with remaining distortions (those not compensated for) subtracted from the input digital signal with subtracted modeled distortions. This yields the modeled distortions added to the remaining distortions at the output of summation node 904. The model processed feedback digital signal is subtracted form the output of summation node 904. The model processed feedback digital signal is the model processed input digital signal ($v_n$) and the model processed remaining distortions (which is considerably smaller than the other signals). So, the output of summation node 906 is approximately the output of summation node 904 less the model processed input digital input signal ($v_n$), which is the model processed input digital input signal ($v_n$) plus remaining distortions less the input digital input signal ($v_n$). This yields an error signal proportional to the remaining distortions at the output of summation node 906.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of processing a signal comprising:
   generating a digital signal, wherein generating comprising compensating for distortions, wherein compensating for the distortions comprise processing the digital signal using a model to create a predicted distorted digital signal and subtracting the predicted distorted digital signal from the digital signal to create a precompensated digital signal;
   converting the precompensated digital signal to an analog signal;
   generating an amplified analog signal having distortions, wherein the distortions in the amplified analog output signal are reduced;
   converting the amplified analog signal to a feedback digital signal at a sample rate; and
   updating a model of the distortions based on the feedback digital signal, wherein updating the model is calculating the model based on an error signal, wherein the error signal is derived from the difference between the feedback digital signal and a sum of a precompensated digital signal and a model processed precompensated digital signal.

2. A method as in claim 1, further including upshifting the digital signal before converting to the analog signal and downshifting before converting the amplified analog signal to the feedback digital signal.

3. method as in claim 1, further including upshifting the analog signal before generating the amplified analog signal and downshifting before converting the amplified analog signal to the feedback digital signal.

4. A method as in claim 1, wherein the model includes memory effects.

5. A method as in claim 1, wherein updating the model occurs at a selectable rate.

6. A method as in claim 1, wherein the distortions in the amplified analog output signal are reduced for frequencies higher than half the sample rate of the feedback digital signal.

7. A system for processing a signal comprising:
   a generator of a digital signal, wherein the generator compensates for distortions, wherein compensating for the distortions is processing the digital signal using a model to create a predicted distorted digital signal and subtracting the predicted distorted digital signal from the digital signal to create a precompensated digital signal;
   a first converter for converting the precompensated digital signal to an analog signal;
   an amplifier for generating an amplified analog signal having distortions, wherein the distortions in the amplified analog output signal are reduced;
   a second converter for converting the amplified analog signal to a feedback digital signal at a sample rate; and
   an updater for updating the model of the distortions based on the feedback digital signal, wherein updating the model is calculating the model based on an error signal, wherein the error signal is derived from the difference between the feedback digital signal and a sum of a precompensated digital signal and a model processed precompensated digital signal.

8. A system as in claim 7, further including an upshifter for upshifting the digital signal before converting to the analog signal and downshifting before converting the amplified analog signal to the feedback digital signal.

9. A system as in claim 7, further including an upshifter for upshifting the analog signal before generating the amplified analog signal and downshifting before converting the amplified analog signal to the feedback digital signal.

10. A system as in claim 7, wherein the model includes memory effects.

11. A system as in claim 7, wherein updating the model occurs at a selectable rate.

12. A system as in claim 7, wherein the distortions in the amplified analog output signal are reduced for frequencies higher than half the sample rate of the feedback digital signal.

* * * * *

UNITED STATES PATENT AND TRADEMARK OFFICE
CERTIFICATE OF CORRECTION

PATENT NO. : 7,688,139 B2  Page 1 of 1
APPLICATION NO. : 12/218032
DATED : March 30, 2010
INVENTOR(S) : Roy G. Batruni It is certified that error appears in the above-identified patent and that said Letters Patent is hereby corrected as shown below:

Claim 3
Column 8, line 17 delete "method as in claim 1," and insert -- A method as in claim 1, --

Signed and Sealed this

Twenty-first Day of September, 2010

David J. Kappos
*Director of the United States Patent and Trademark Office*